(12) United States Patent
Chang et al.

(10) Patent No.: US 10,103,078 B2
(45) Date of Patent: Oct. 16, 2018

(54) FORMATION OF GETTER LAYER FOR MEMORY DEVICE

(71) Applicant: Taiwan Semiconductor Manufacturing Company, Ltd., Hsin-Chu (TW)

(72) Inventors: Yao-Wen Chang, Taipei (TW); Cheng-Yuan Tsai, Chu-Pei (TW); Kai-Wen Cheng, Taichung (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 15/626,661

(22) Filed: Jun. 19, 2017

(65) Prior Publication Data
US 2017/0294363 A1 Oct. 12, 2017

Related U.S. Application Data

(62) Division of application No. 15/014,209, filed on Feb. 3, 2016, now Pat. No. 9,685,389.

(51) Int. Cl.
| | |
|---|---|
| H01L 23/26 | (2006.01) |
| H01L 23/522 | (2006.01) |
| H01L 29/792 | (2006.01) |
| H01L 29/66 | (2006.01) |
| H01L 21/768 | (2006.01) |
| H01L 21/02 | (2006.01) |

(52) U.S. Cl.
CPC ........ *H01L 23/26* (2013.01); *H01L 21/02186* (2013.01); *H01L 21/76868* (2013.01); *H01L 21/76877* (2013.01); *H01L 23/5226* (2013.01); *H01L 29/66833* (2013.01); *H01L 29/792* (2013.01)

(58) Field of Classification Search
CPC ...................................................... H01L 23/26
See application file for complete search history.

(56) References Cited

U.S. PATENT DOCUMENTS

| | | | |
|---|---|---|---|
| 8,605,523 | B2 | 12/2013 | Tao et al. |
| 8,630,132 | B2 | 1/2014 | Cheng et al. |
| 8,760,948 | B2 | 6/2014 | Tao et al. |
| 8,869,436 | B2 | 10/2014 | Tsai et al. |
| 9,685,389 | B1 | 6/2017 | Chang et al. |
| 2013/0234094 | A1 | 9/2013 | Chang et al. |
| 2013/0335041 | A1 | 12/2013 | Baek et al. |
| 2013/0336041 | A1 | 12/2013 | Tsai et al. |
| 2014/0032871 | A1 | 1/2014 | Hsu et al. |
| 2014/0146593 | A1 | 5/2014 | Tsai et al. |
| 2014/0153321 | A1 | 6/2014 | Liaw |
| 2014/0153345 | A1 | 6/2014 | Kim et al. |

(Continued)

*Primary Examiner* — Marvin Payen
(74) *Attorney, Agent, or Firm* — Haynes and Boone, LLP

(57) ABSTRACT

A method includes providing a semiconductor device disposed on a substrate, wherein the semiconductor device includes a semiconductor device feature, forming a conductive layer over the substrate such that the conductive layer is electrically coupled to the semiconductor device feature, forming a getter layer over the conductive layer, wherein the getter layer includes a first layer that is formed of titanium and a second layer overlying the first layer that is formed of tantalum nitride, and forming an interconnect layer over the getter layer such that the interconnect layer is electrically coupled to the semiconductor device feature.

20 Claims, 12 Drawing Sheets

(56) References Cited

U.S. PATENT DOCUMENTS

| | | |
|---|---|---|
| 2014/0156961 A1 | 6/2014 | Hadley |
| 2014/0166961 A1 | 6/2014 | Liao et al. |
| 2014/0175365 A1 | 6/2014 | Chang et al. |
| 2014/0177352 A1 | 6/2014 | Lum |
| 2014/0203236 A1 | 7/2014 | Chen et al. |
| 2014/0233330 A1 | 8/2014 | Ko et al. |
| 2014/0241077 A1 | 8/2014 | Katoch et al. |
| 2014/0264222 A1 | 9/2014 | Yang et al. |
| 2014/0264233 A1 | 9/2014 | Tu et al. |
| 2014/0269114 A1 | 9/2014 | Yang et al. |

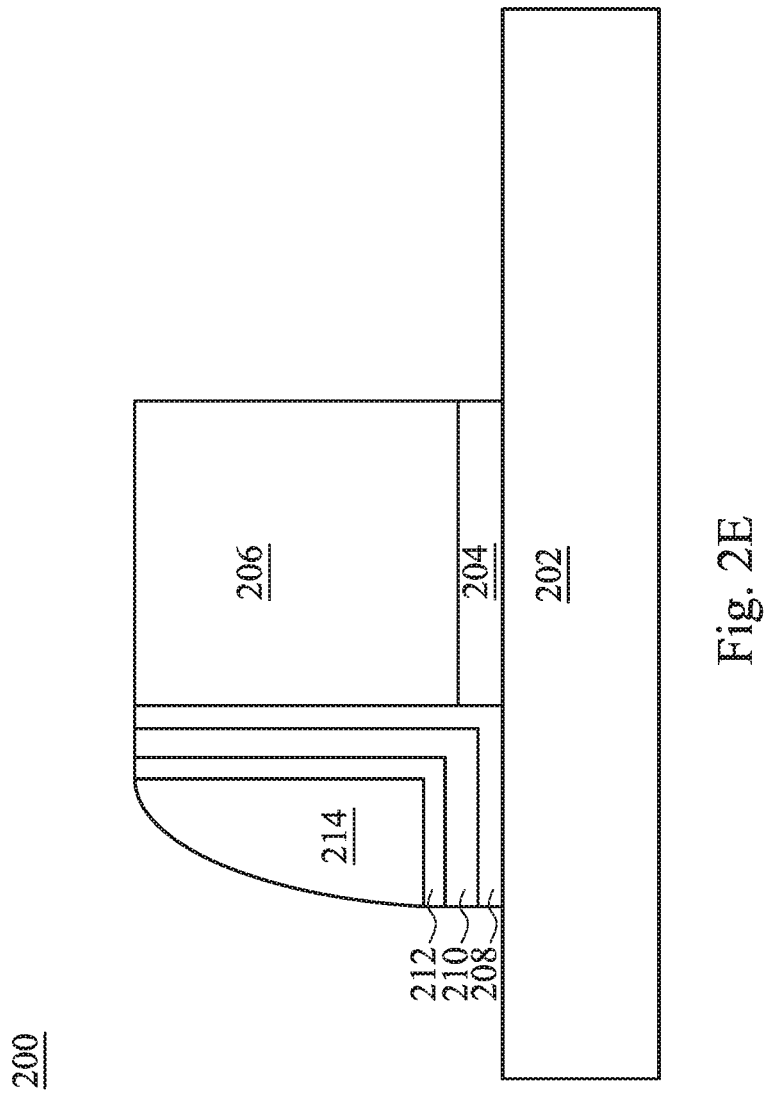

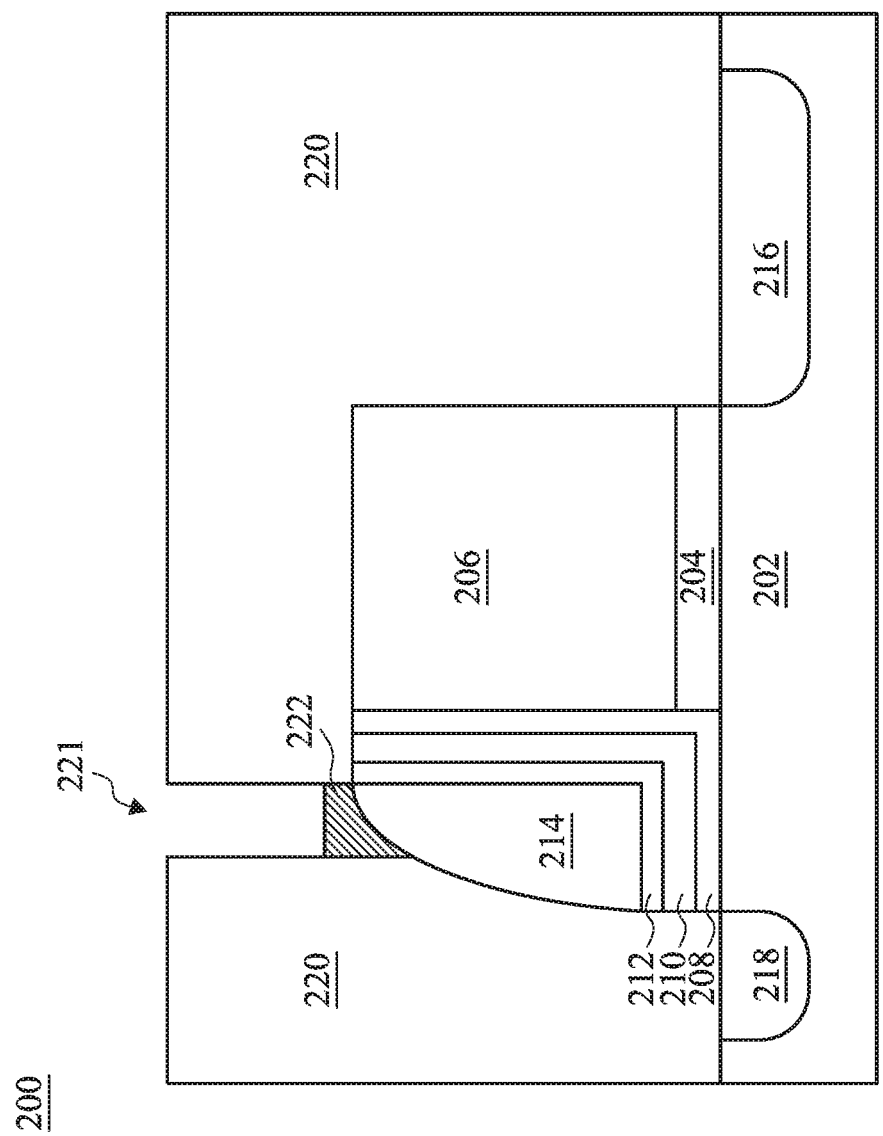

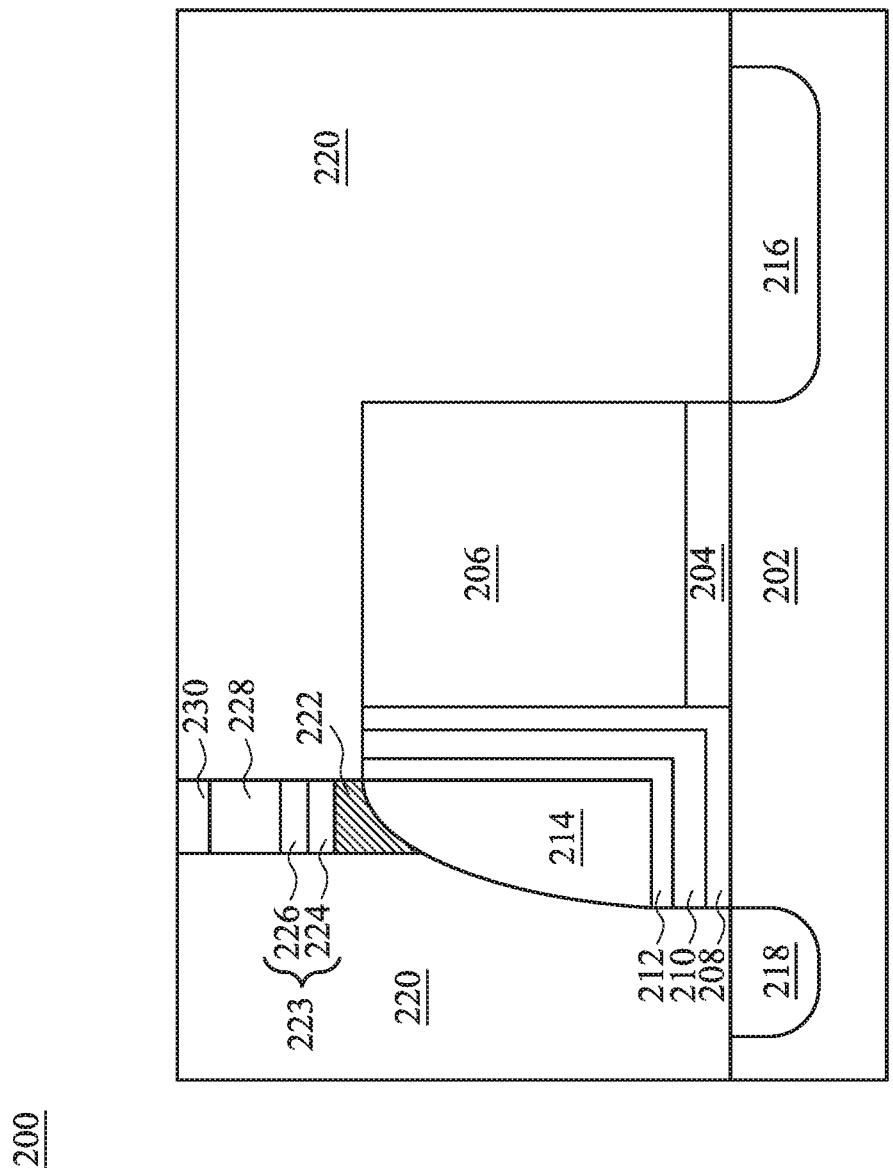

FORMATION OF GETTER LAYER FOR MEMORY DEVICE

PRIORITY INFORMATION

This application is a divisional of U.S. patent application Ser. No. 15/014,209 filed Feb. 3, 2016 and entitled "Formation of Getter Layer for Memory Device," the disclosure of which is hereby incorporated by reference in the entirety.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

Many of the technological advances in semiconductors have occurred in the field of memory devices, especially non-volatile memory devices. A variety of structures and configurations have been developed to scale up a memory density in the non-volatile memory device such as for example, programmable-read-only memory (PROM), erasable-programmable-read-only memory (EPROM), and electrically-erasable-programmable-read-only memory (EEPROM). One of the dielectric structures used in fabricating an EEPROM device is referred to as an oxide-nitride-oxide (ONO) structure. Quality of the ONO structure plays a crucial role in terms of determining the performance of a memory device. Thus, a memory device that has improved qualities of an ONO structure (e.g., non-contaminated ONO structure) is needed.

BRIEF DESCRIPTION OF THE DRAWINGS

Aspects of the present disclosure are best understood from the following detailed description when read with the accompanying figures. It is emphasized that, in accordance with the standard practice in the industry, various features of the figures are not drawn to scale. In fact, the dimensions of the various features may be arbitrarily increased or reduced for clarity of discussion.

FIGS. 2A, 2B, 2C, 2D, 2E, 2F, 2G, 2H, 2I, 2J, and 2K depict cross-sectional views of a memory device fabricated by the method of FIG. 1 in accordance with various embodiments.

Figure 1:
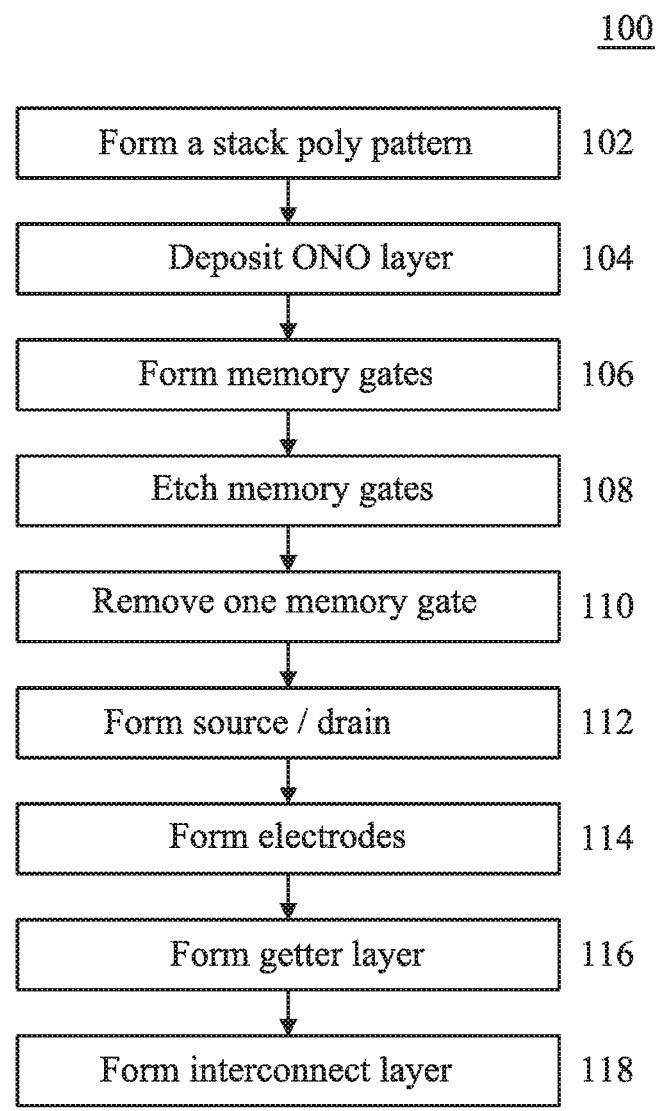
FIG. 1 depicts a method of fabricating a memory device in accordance with various embodiments.

The various features disclosed in the drawings briefly described above will become more apparent to one of skill in the art upon reading the detailed description below. Where features depicted in the various figures are common between two or more figures, the same identifying numerals have been used for clarity of description.

DETAILED DESCRIPTION

It is to be understood that the following disclosure provides many different embodiments and examples for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features in the figures may be arbitrarily drawn in different scales for the sake of simplicity and clarity.

Many of the technological advances in semiconductors have occurred in the field of memory devices, especially non-volatile memory devices. A variety of structures and configurations have been developed to scale up a memory density in the non-volatile memory device such as for example, programmable-read-only memory (PROM), erasable-programmable-read-only memory (EPROM), and electrically-erasable-programmable-read-only memory (EEPROM). One of the dielectric structures used in fabricating an EEPROM device is referred to as an oxide-nitride-oxide (ONO) structure. As the name implies, an ONO structure includes a stack dielectric layers comprising a bottom oxide material layer, a nitride layer disposed over the bottom oxide material layer, and a top oxide layer disposed over the nitride layer. During programming of an EEPROM device, an electrical charge is transferred from a substrate to the nitride layer of the ONO structure. Voltages are applied to a gate and a drain creating a vertical electrical field and a lateral electrical field, which accelerate electrons along a channel. As the electrons move along the channel, some of the electrons gain sufficient energy to jump over the bottom oxide material layer of the ONO structure and become trapped in the nitride layer. As such, quality of the ONO structure plays a crucial role in terms of determining the performance of a memory device that includes such an ONO structure. As discussed below, the present disclosure describes methods for fabricating a memory device having an improved quality of an ONO structure (e.g., non-contaminated ONO structure).

FIG. 1 is a flowchart of a method 100 of fabricating a memory device (or semiconductor device) 200 constructed according to various aspects of the present disclosure in one or more embodiments. The method 100 is described with reference to FIG. 1 and in conjunction with FIGS. 2A, 2B, 2C, 2D, 2E, 2F, 2G, 2H, 2I, 2J, and 2K. FIGS. 2A-2K are cross sectional views of forming the memory device 200 by the method 100 according to some embodiments. In some embodiments, the memory device 200 fabricated according to the disclosed method 100 may be, in part, a memory element of a non-volatile memory device and such a memory element is a split-gate thin-film storage device although the memory element may be one of a variety of suitable storage/memory devices. It is understood that additional steps can be provided before, during, and/or after the method 100, and some of the steps described can be replaced, eliminated, and/or moved around for additional embodiments of the method 100.

Figure 2A:
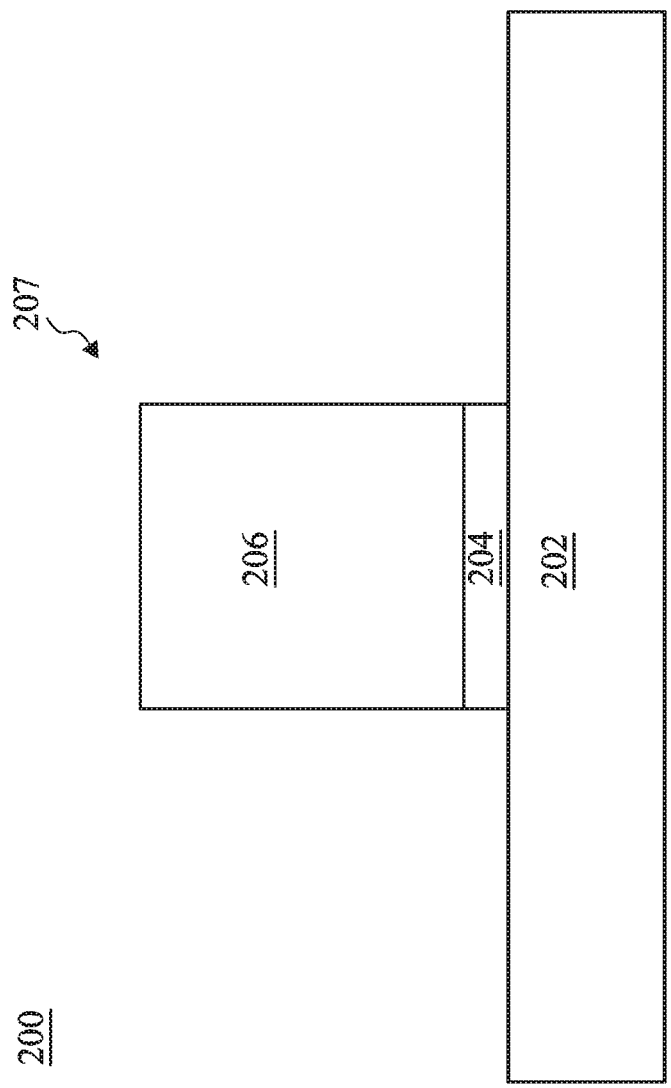

Referring to FIGS. 1 and 2A, the method 100 begins at step 102 by forming a control gate 207 as shown in FIG. 2A. The step 102 includes receiving a substrate 202, depositing a tunneling layer 204 over the substrate 202, depositing a poly-silicon layer 206 over the tunneling layer 204, and forming the control gate over the substrate 202 as shown in FIG. 2A. In some embodiments, the step 102 also includes a lithography process to form a photo resist pattern, an etching process and a cleaning process to form the patterned poly-silicon stack.

In an embodiment, the substrate 202 is a semiconductor substrate and includes silicon. Alternatively, the substrate includes germanium, silicon germanium or other proper semiconductor materials such as III/V materials. In another embodiment, the substrate 202 may include a buried dielectric material layer for isolation formed by a proper technology, such as a technology referred to as separation by implanted oxygen (SIMOX). In some embodiments, the substrate 202 may be a semiconductor on insulator, such as silicon on insulator (SOI). In some embodiments, the tunneling layer 204 may be formed of dielectric materials or high-k materials.

Although in the illustrated embodiment of FIG. 2A, the layer 206 is formed of poly-silicon, the layer 206 may be formed of any of a variety of conductive materials such as for example, a metal, a metal alloy, a metal compound, a doped semiconductor material (e.g., a poly-silicon material), or any combination thereof.

Figure 2B:
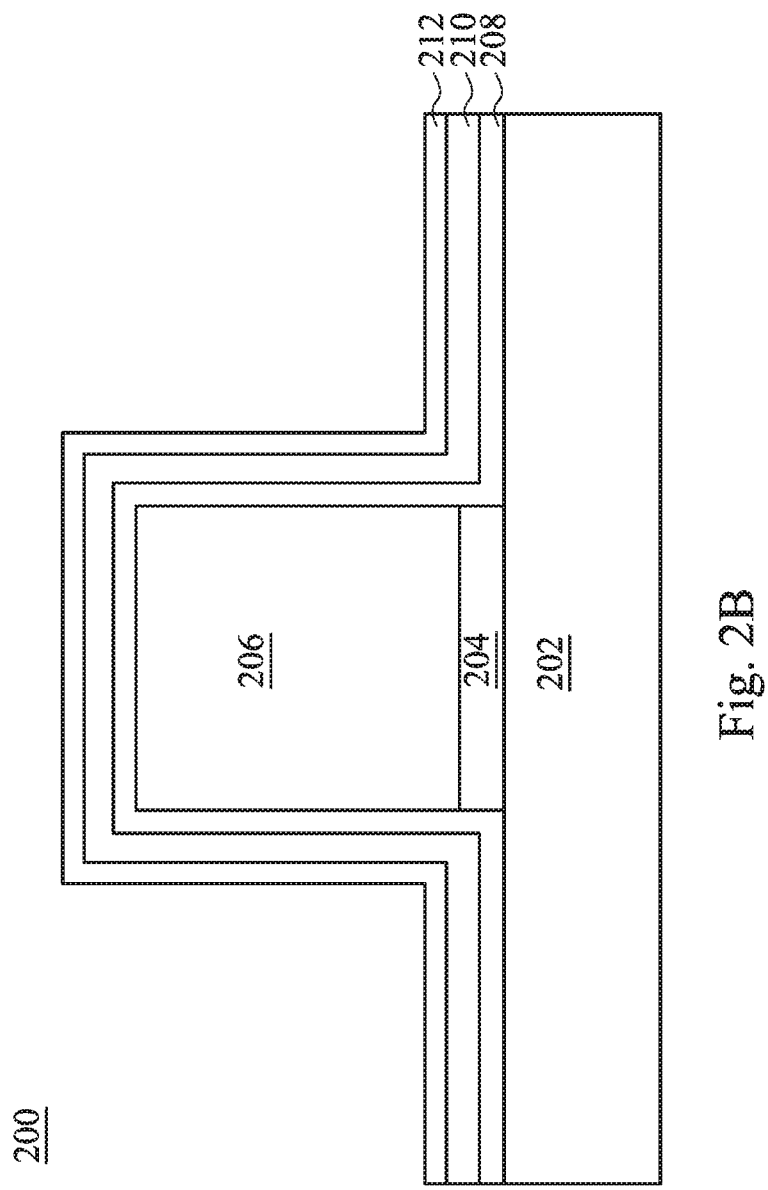

Referring back to FIG. 1, the method 100 proceeds to step 104 by depositing an oxide-nitride-oxide (ONO) layer over the control gate 207 as shown in FIG. 2B. Step 104 includes depositing an oxide layer 208 (e.g., silicon oxide) over the control gate 207 and the substrate 202, depositing a nitride layer 210 (e.g., silicon nitride) over the oxide layer 208, and depositing another oxide layer 212 (e.g., silicon oxide) over the nitride layer 210. In some embodiments, the step 104 is also referred to as depositing an ONO (oxide-nitride-oxide) layer.

Figure 2C:
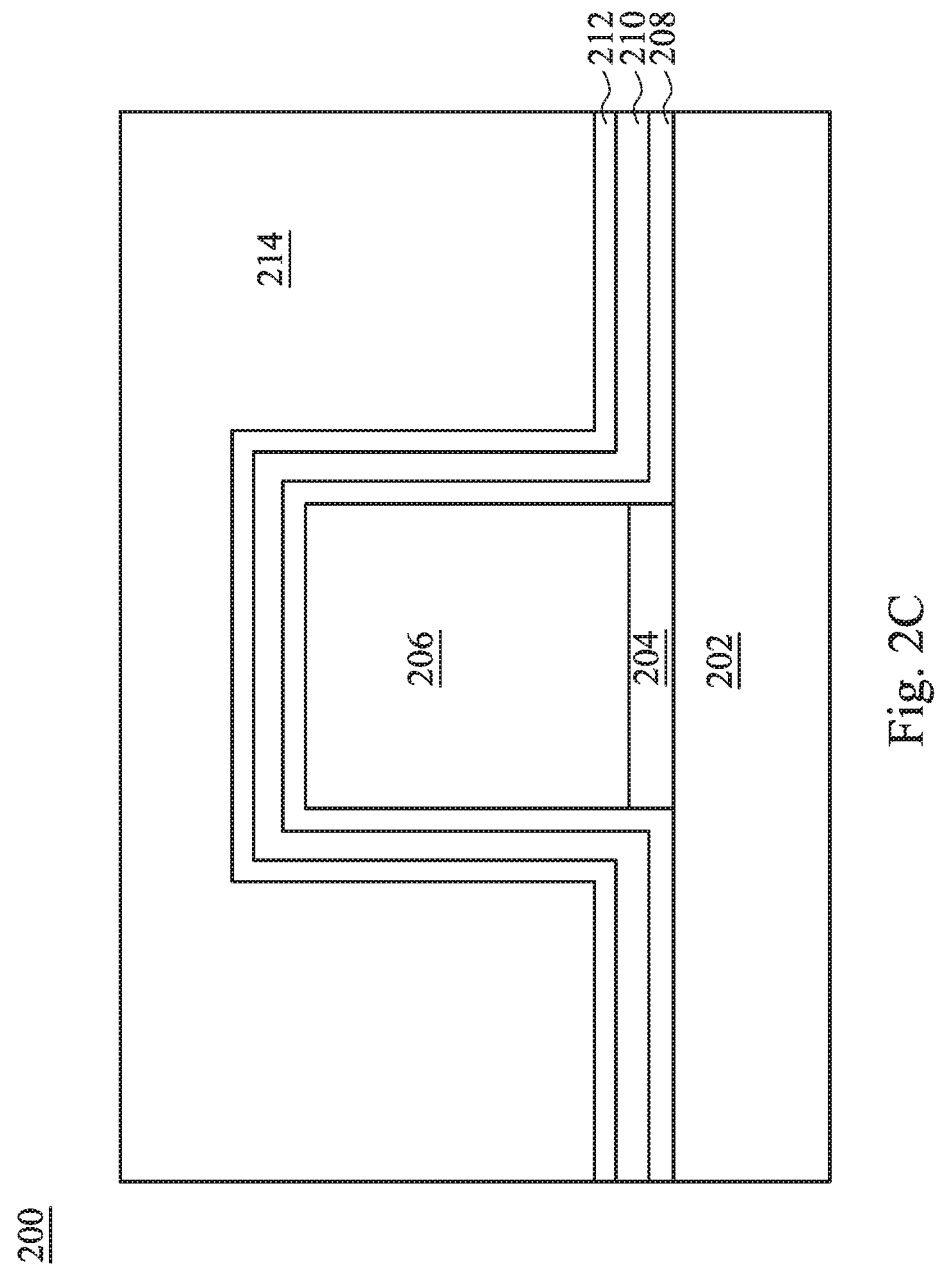

The method 100 continues to step 106 by forming a memory gate as shown in FIG. 2C. Step 106 includes depositing a memory gate layer 214 over the oxide layer 212. The step 106 also includes applying a lithography process, an etching process, and a cleaning process to form the memory gate 214 as shown in FIG. 2C. In some embodiments, the memory gate layer 214 is also referred to as the memory gate 214, or a main gate.

Figure 2D:
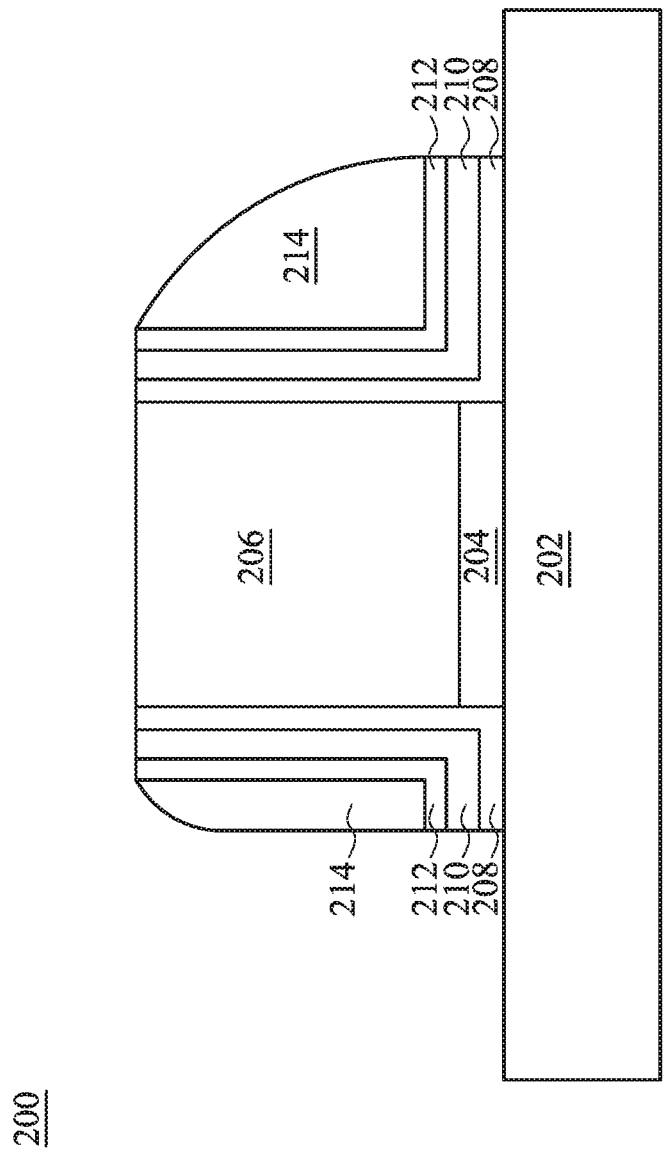

Referring to FIG. 2D, the method 100 then proceeds to step 108 by further etching the memory gate 214. Step 108 includes removing portions of the memory gate layer 214, the oxide layer 212, the nitride layer 210, and the oxide on top of the control gate 206 by etching process as shown in FIG. 2D. After the etching process at step 108, the control gate 207 is exposed. In some embodiments, the etching process may include a deposition process (e.g., a deposition of photoresist), a photolithography process, a wet/dry etching process, or a combination thereof.

Referring to FIG. 2E, the method 100 then proceeds to step 110 to remove the memory gate 214 from one side of the control gate 207. In the illustrated embodiment, the memory gate at the right side is removed to be formed as show in FIG. 2E. As shown, removal of memory gate 114 also includes removing a portion of each of the memory gate layer 214, the oxide layer 212, the nitride layer 210, and the oxide 208 in contact with the substrate 202.

Figure 2F:
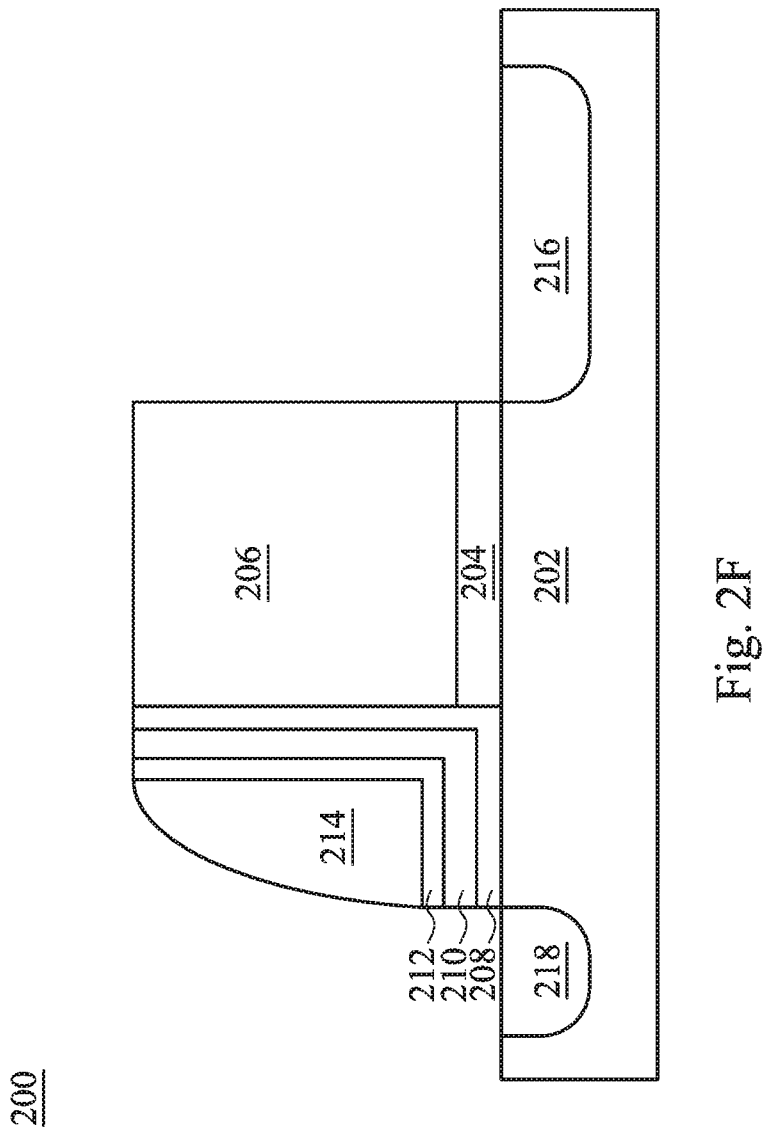

Referring to FIG. 2F, the method 100 proceeds to step 112 by forming a source 216 and a drain 218 in the substrate 202. The source 216 and drain 218 may be formed via epitaxially growing and/or one of a variety of suitable processes such as such as a CVD process. The step 112 may include a photo lithography process to define an ion implantation region. In the example of forming the source 216 and drain 218 via the epitaxially growing may include a recessing process to form a trench/recess, then an epitaxial growing process, and then a planarization process. Further, the formed source 216 and drain 218 may be formed of similar and/or different materials than the substrate 202.

Figure 2G:
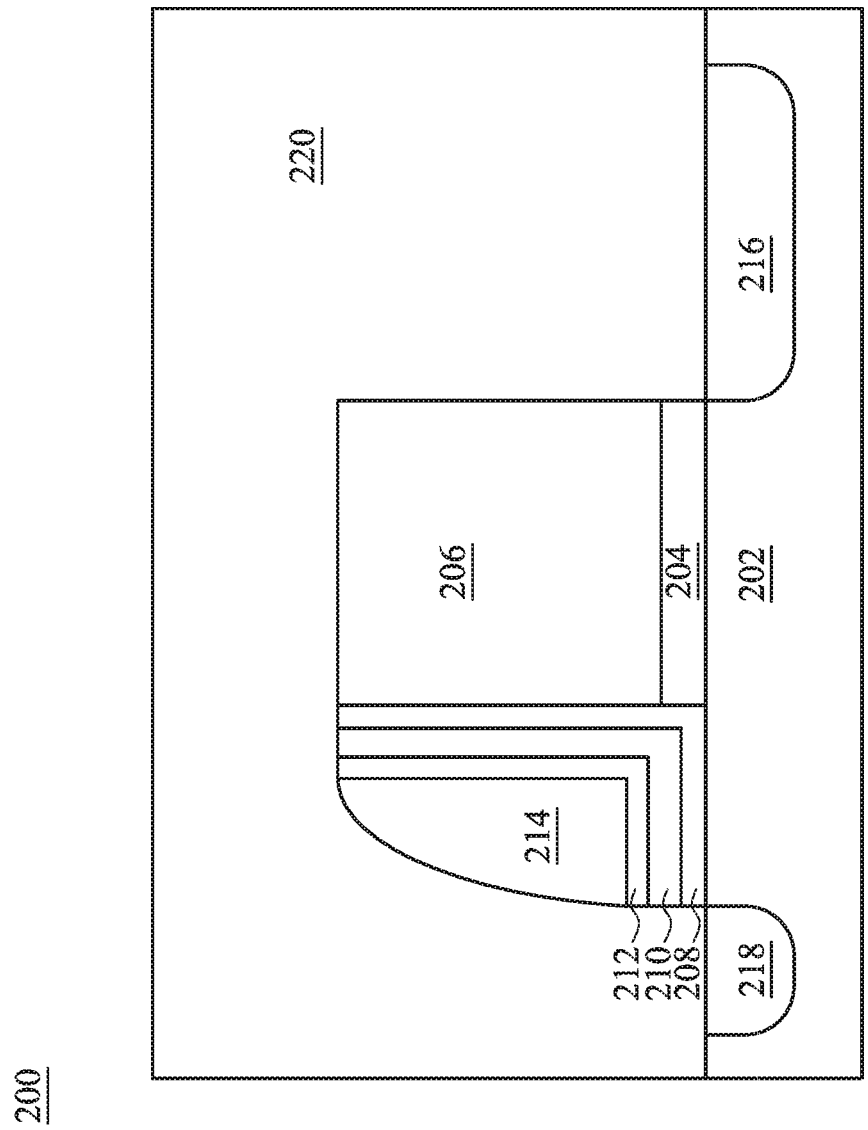

The method 100 proceeds to step 114 to form an electrode for each respective device feature (e.g., the control gate 207, the memory gate 214, the source 216, and the drain 218). In an example of forming electrode 222 for the memory gate 214 such that the electrode 222 is electrically coupled to the memory gate 214, the step 114 includes forming a dielectric layer 220 (e.g., an IMD layer) over the substrate 202 as shown in FIG. 2G. In some specific embodiments, the dielectric layer 220 may be formed of a material different from the ONO layer such as, for example, any of a variety of materials that are suitable to insulate an interconnect line described below.

As shown in FIG. 2H, dielectric layer 220 is patterned so as to expose a portion of the top surface of the memory gate 214. That is, dielectric layer 220 is patterned to form a trench 221 that exposed memory gate 214. The patterning process may include a deposition process (e.g., a deposition of photoresist), a photolithography process, a wet/dry etching process, or a combination thereof. Electrode 222 is then formed within trench 221 as illustrated in FIG. 2H. Forming of electrode 222 within trench 221 may occur through depositing a conductive material within the trench 221. The conductive material forming gate electrode 222 may include a material such as metal material (e.g., copper, aluminum, etc.) and/or poly-semiconductor material (e.g., poly-silicon). The forming of the electrode 222 illustrated in FIG. 2H is merely an example, one of a variety of approaches that are suitable for forming an electrode may be used while remaining within the scope of the present disclosure.

Figure 2I:
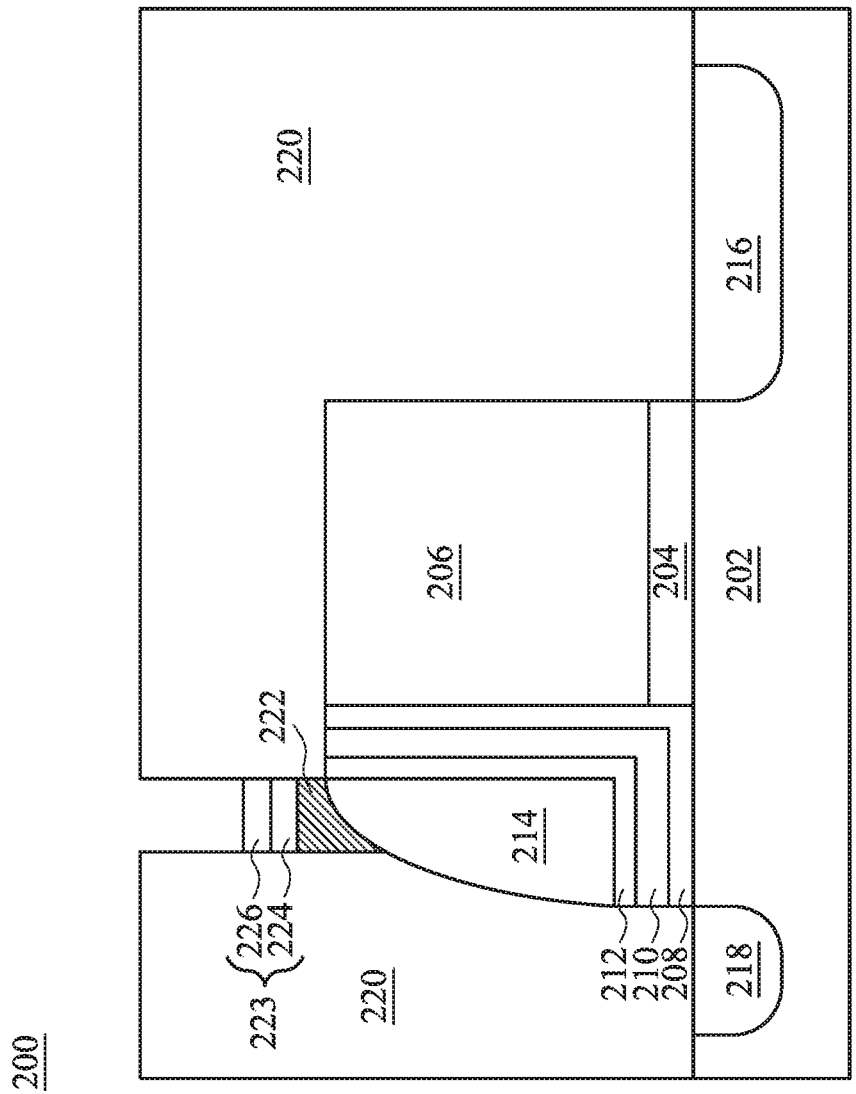

As illustrated in FIG. 2I, the method 100 proceeds to step 116 by forming a getter layer 223 over the electrode 222. In the current embodiment, the getter layer 223 is a multi-stack layer that includes a first layer 224 and a second layer 226. Here, first layer 224 and second layer 226 are formed of different materials. For example, first layer 224 includes a metal material and second layer 226 includes a metal nitride material. In that regard, first layer 224 is formed of titanium (Ti), zirconium (Zr), and/or hafnium (Hf) and second layer 226 is formed of tantalum nitride (TaN). Further, the first layer 224 may have a thickness of about 500 angstroms and the second layer 226 may have a thickness of about 1,500 angstroms. That is, in some embodiment the second layer 226 is three times the thickness of first layer 224. Although forming the getter layer 223 may be implemented by using a physical vapour deposition (PVD) process in the current embodiment, any of a variety of deposition processes (ALD, CVD, etc.) may be used and remaining within the scope of the present disclosure.

In some embodiments, the getter layer 223 may be configured to collect (or immobilize) a variety of chemical species. The chemical species may include hydrogen, water, and/or other chemical species. Immobilizing these chemical species may advantageously reduce or eliminate a variety of adverse effects to the memory device 200. Further, the getter layer 223 may be configured to block such chemical species that may enter the device memory 200 during a subsequent fabrication/testing process. In an example, during a high temperature reliability test on a fabricated memory device, hydrogen atoms may enter/flow into the ONO layer of a memory device. Such "trespassing" of the hydrogen atoms may disadvantageously affect performance of the memory device such as for example, degraded retention, instable threshold voltage, etc. Thus, the present disclosure advantageously provides the formation of the getter layer 223 so as to block the trespassing of hydrogen atoms into the memory device 200 and/or an element of the memory device 200 (the ONO layer).

Referring to FIGS. 1 and 2J, the method 100 proceeds to step 118 by forming an interconnect layer 228 and top conductive layer 230 over the getter layer 223. In some embodiments, interconnect layer 228 electrically couples electrode 222 and top conductive layer 230. Interconnect layer 228 may be a bonding pad layer in the current embodiment. The interconnect layer 228 is generally formed of conductive material such as for example, aluminum, copper, or any combination thereof. In some embodiments, the top conductive layer 230 may be formed of titanium nitride.

Figure 2K:
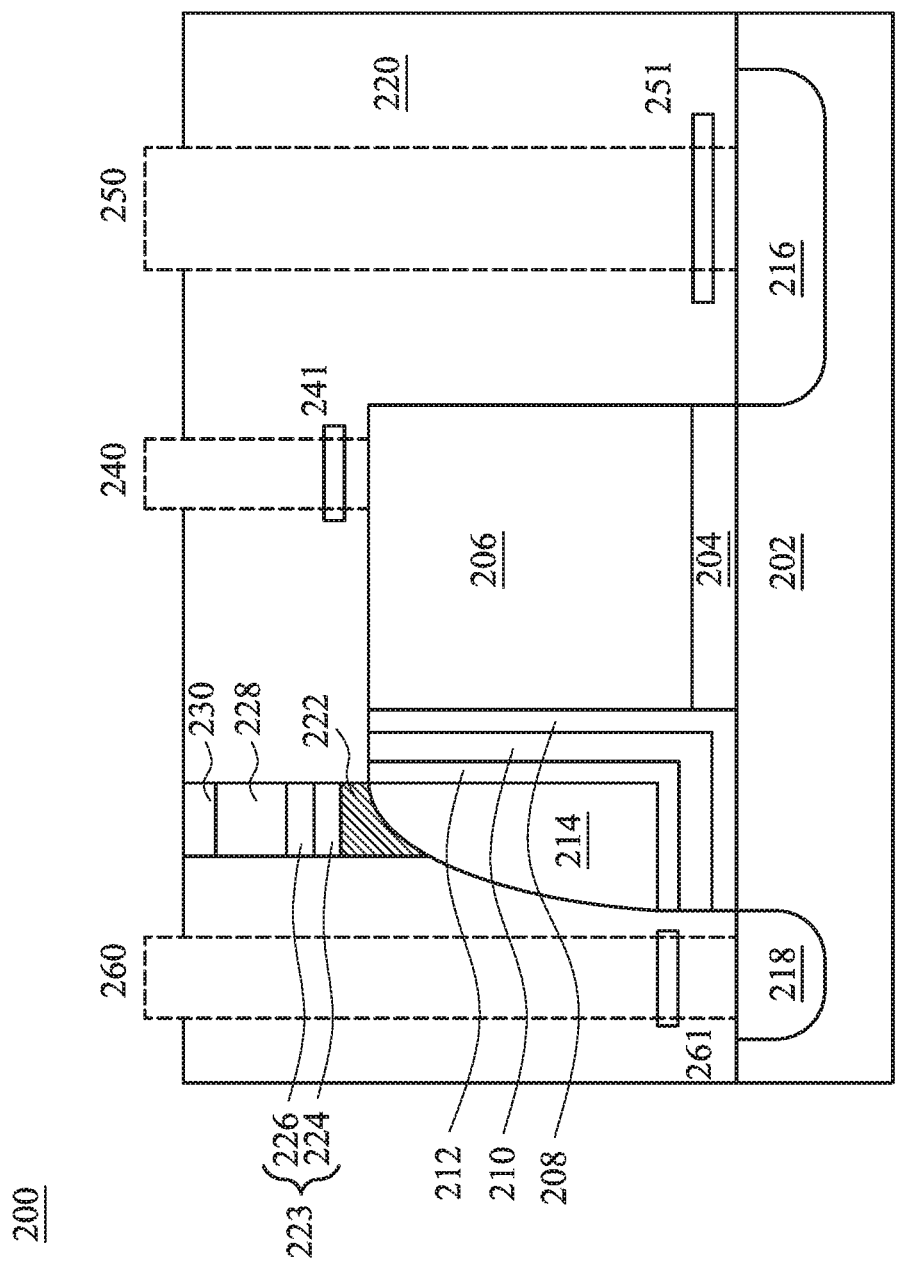

The method 100 may include additional steps. For example, as illustrated in FIG. 2K, interconnect features 240, 250, and 260 may each be formed to electrically couple to the device feature: the control gate 207, the source 250, and the drain 260. Each of the interconnect features 240, 250, and 260 may similarly include a getter layer (e.g., 241, 251, and 261) that is configured to block the trespassing of hydrogen atoms.

Various embodiments of a method of fabricating a memory device are disclosed. In an embodiment, the method includes providing a semiconductor device disposed on a substrate, wherein the semiconductor device includes a semiconductor device feature; forming a conductive layer over the substrate such that the conductive layer is electrically coupled to the semiconductor device feature; forming a getter layer over the conductive layer, wherein the getter layer includes a first layer that is formed of titanium and a second layer overlying the first layer that is formed of tantalum nitride; and forming an interconnect layer over the getter layer such that the interconnect layer is electrically coupled to the semiconductor device feature.

In another embodiment, an embodiment of a memory device is disclosed. The memory device includes a multi-stack dielectric layer over a substrate; a first conductive layer over the multi-stack dielectric layer; a second conductive layer over the first conductive layer; a getter layer over the second conductive layer, wherein the getter layer includes a first layer that is formed of titanium and a second layer overlying the first layer that is formed of tantalum nitride; and an interconnect layer over the getter layer such that the interconnect layer is electrically coupled to the first conductive layer.

Yet in another embodiment, an embodiment of a memory device is disclosed. The memory device includes a semiconductor substrate; a multi-stack dielectric layer on the semiconductor substrate; a gate on the multi-stack dielectric layer; a conductive layer formed over the gate; a getter layer overlaying the conductive layer, wherein the getter layer includes a first layer that is formed of titanium and a second layer overlying the first layer that is formed of tantalum nitride; and a bonding pad layer formed over the getter layer thereby the bonding pad layer being electrically coupled to the gate.

The foregoing has outlined features of several embodiments so that those skilled in the art may better understand the detailed description. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    providing a semiconductor device disposed on a substrate, wherein the semiconductor device includes a semiconductor device feature;
    forming a conductive layer over the substrate such that the conductive layer is electrically coupled to the semiconductor device feature;
    forming a getter layer over the conductive layer, wherein the getter layer includes a first layer that is formed of titanium and a second layer overlying the first layer that is formed of tantalum nitride; and
    forming an interconnect layer over the getter layer such that the interconnect layer is electrically coupled to the semiconductor device feature.

2. The method of claim 1, wherein the semiconductor device is a split-gate metal-oxide-nitride-oxide-semiconductor (SG-MONOS) storage device.

3. The method of claim 2, wherein the semiconductor device feature includes at least one of: a source feature of the SG-MONOS storage device, a drain feature of the SG-MONOS storage device, a control gate feature of the SG-MONOS storage device, and a select feature of the SG-MONOS storage device.

4. The method of claim 1, wherein the first layer of the getter layer is formed of zirconium.

5. The method of claim 1, wherein the first layer of the getter layer is formed of hafnium.

6. The method of claim 1, wherein the first layer of the getter layer includes a thickness that is about 500 angstroms, and the second layer of the getter layer includes a thickness that is about 1500 angstroms.

7. The method of claim 1, wherein forming the getter layer includes a physical vapour deposition (PVD) process.

8. The method of claim 1, wherein the interconnect layer is a bonding pad layer.

9. A method for forming a semiconductor device, the method comprising:
    forming a multi-stack dielectric layer on a semiconductor substrate;
    forming a gate on the multi-stack dielectric layer;
    forming a conductive layer over the gate;
    forming a getter layer overlaying the conductive layer, wherein the getter layer includes a first layer that is formed of titanium and a second layer overlying the first layer that is formed of tantalum nitride; and
    forming a bonding pad layer over the getter layer thereby the bonding pad layer being electrically coupled to the gate.

10. The method of claim 9, wherein the semiconductor device is a split-gate metal-oxide-nitride-oxide-semiconductor (SG-MONOS) storage device.

11. The method of claim 10, wherein the semiconductor device feature includes a source feature of the SG-MONOS storage device.

12. The method of claim 10, wherein the semiconductor device feature includes a drain feature of the SG-MONOS storage device.

13. The method of claim 10, wherein the semiconductor device feature includes a control gate feature of the SG-MONOS storage device.

14. The method of claim 10, wherein the semiconductor device feature includes a select feature of the SG-MONOS storage device.

15. The method of claim 9, wherein the first layer of the getter layer includes a thickness that is about 500 angstroms.

16. The method of claim 9, wherein the second layer of the getter layer includes a thickness that is about 1500 angstroms.

17. The method of claim 9, wherein forming the getter layer includes a deposition process.

18. A method for forming a memory device, the method comprising:

forming a multi-stack dielectric layer over a substrate;

forming a first conductive layer over the multi-stack dielectric layer;

forming a second conductive layer over the first conductive layer;

forming a getter layer over the second conductive layer, wherein the getter layer includes a first layer that is formed of titanium and a second layer overlying the first layer that is formed of tantalum nitride; and forming an interconnect layer over the getter layer such that the interconnect layer is electrically coupled to the first conductive layer.

19. The method of claim 18, further comprising, forming a drain region adjacent the multi-stack layer.

20. The method of claim 18, wherein the multi-stack dielectric layer is formed along the substrate and along a sidewall of a control gate.

\* \* \* \* \*